US011721633B2

(12) United States Patent
Takahashi et al.

(10) Patent No.: US 11,721,633 B2
(45) Date of Patent: Aug. 8, 2023

(54) SEMICONDUCTOR DEVICE

(71) Applicant: FUJI ELECTRIC CO., LTD., Kawasaki (JP)

(72) Inventors: Masaki Takahashi, Matsumoto (JP); Kousuke Komatsu, Matsumoto (JP); Rikihiro Maruyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 91 days.

(21) Appl. No.: 17/514,566

(22) Filed: Oct. 29, 2021

(65) Prior Publication Data

US 2022/0208685 A1 Jun. 30, 2022

(30) Foreign Application Priority Data

Dec. 28, 2020 (JP) ................................ 2020-218274

(51) Int. Cl.

| | |
|---|---|
| ***H01L 23/538*** | (2006.01) |
| ***H01L 25/07*** | (2006.01) |
| ***H01L 25/18*** | (2023.01) |
| ***H02M 7/00*** | (2006.01) |
| *H02M 7/06* | (2006.01) |
| *H01L 23/053* | (2006.01) |
| *H02M 7/5387* | (2007.01) |

(52) U.S. Cl.

CPC ........ *H01L 23/5386* (2013.01); *H01L 25/072* (2013.01); *H01L 25/18* (2013.01); *H02M 7/003* (2013.01); *H01L 23/053* (2013.01); *H02M 7/06* (2013.01); *H02M 7/5387* (2013.01)

(58) Field of Classification Search

CPC . H05K 7/1432; H01L 23/538; H01L 23/5386; H01L 23/053; H01L 25/07; H01L 25/18; H02M 7/00; H02M 7/003; H02M 7/06; H02M 7/5387

USPC ................ 361/753, 760, 772–778, 784, 813; 257/660–676; 439/76.1

See application file for complete search history.

(56) References Cited

U.S. PATENT DOCUMENTS

| | | | | |
|---|---|---|---|---|
| 5,512,782 A * | 4/1996 | Kobayashi | H02M 7/003 | 257/691 |
| 9,418,975 B1 * | 8/2016 | Yoneyama | H01L 23/50 | |
| 10,186,978 B2 * | 1/2019 | Yamaguchi | H02M 7/537 | |
| 2012/0261825 A1 * | 10/2012 | Koike | H01L 23/49562 | 257/773 |

(Continued)

FOREIGN PATENT DOCUMENTS

| | | |
|---|---|---|
| JP | S64-77153 A | 3/1989 |
| JP | H09-219970 A | 8/1997 |

(Continued)

*Primary Examiner* — Tuan T Dinh

(74) *Attorney, Agent, or Firm* — Rabin & Berdo, P.C.

(57) ABSTRACT

A circuit pattern, which is a second negative electrode wiring, and a horizontally extending area of a circuit pattern, which is a first negative electrode wiring, are connected electrically and mechanically by a vertically extending area of the circuit pattern and wires, which are an inter-negative-electrode wiring. As a result, N terminals and N1 terminals are equal in potential in a semiconductor device. The N terminals of a converter circuit section and the N1 terminals of an inverter circuit section are electrically connected to make the N terminals and the N1 terminals equal in potential.

16 Claims, 8 Drawing Sheets

(56) References Cited

U.S. PATENT DOCUMENTS

| | | | | |
|---|---|---|---|---|
| 2015/0084173 | A1* | 3/2015 | Zhang | H01L 23/49541 257/676 |
| 2016/0036343 | A1 | 2/2016 | Yamaguchi et al. | |
| 2018/0182694 | A1* | 6/2018 | Soyano | H01L 23/49575 |
| 2020/0214088 | A1* | 7/2020 | Sugimoto | H03K 17/04126 |

FOREIGN PATENT DOCUMENTS

| | | | |
|---|---|---|---|
| JP | 2002-238260 | A | 8/2002 |
| JP | 2010-284079 | A | 12/2010 |
| JP | 2016-032021 | A | 3/2016 |

* cited by examiner

SEMICONDUCTOR DEVICE

CROSS-REFERENCE TO RELATED APPLICATION

This application is based upon and claims the benefit of priority of the prior Japanese Patent Application No. 2020-218274, filed on Dec. 28, 2020, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power converters. The power devices are insulated gate bipolar transistors (IGBTs), power metal oxide semiconductor field effect transistors (MOSFETs), or the like. Furthermore, such a semiconductor device includes semiconductor elements including power devices and a plurality of ceramic circuit boards. A converter circuit section, an inverter circuit section, and a brake circuit section are made up of the semiconductor elements and the plurality of ceramic circuit boards.

With the above semiconductor device there is need for a negative electrode of the converter circuit section and a negative electrode of the inverter circuit section to be equal in potential. External connection terminals electrically connected to the negative electrode of the converter circuit section and the negative electrode of the inverter circuit section are formed on a case of the semiconductor device. The external connection terminal of the converter circuit section and the external connection terminal of the inverter circuit section are connected electrically and mechanically by a wiring member from the outside of the semiconductor device. The negative electrode of the converter circuit section and the negative electrode of the inverter circuit section become equal in potential in this way.

Japanese Laid-open Patent Publication No. 2002-238260

With the above semiconductor device the external connection terminals are connected electrically and mechanically by the wiring member from the outside of the semiconductor device. However, this needs complicated work. Furthermore, in addition to the external connection terminals corresponding to the negative electrode of the converter circuit section and the negative electrode of the inverter circuit section, external connection terminals corresponding to positive electrodes, control, an output, and the like are formed on the case of the semiconductor device. If the external connection terminals corresponding to the negative electrodes are connected by the wiring member outside the semiconductor device, then the wiring member will impede wiring to other external connection terminals.

SUMMARY OF THE INVENTION

According to an aspect, there is provided a semiconductor device including: a converter circuit including a first positive electrode wiring as a positive electrode of the converter circuit, a first negative electrode wiring as a negative electrode of the converter circuit, and an input wiring as an input of the converter circuit; an inverter circuit including a second positive electrode wiring as a positive electrode of the inverter circuit, a second negative electrode wiring as a negative electrode of the inverter circuit, and an output wiring as an output of the inverter circuit; an inter-negative-electrode wiring disposed between the converter circuit and the inverter circuit and electrically connecting the first negative electrode wiring and the second negative electrode wiring; and a plurality of terminals including a first negative electrode terminal electrically connected to the first negative electrode wiring, a second negative electrode terminal electrically connected to the second negative electrode wiring, and an output terminal disposed between the first negative electrode terminal and the second negative electrode terminal and being electrically connected to the output wiring.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described by reference to the accompanying drawings. In the following description a "front surface" or an "upper surface" indicates a surface of a semiconductor device 10 of FIG. 1 which faces this side of the paper (+Z direction). Similarly, an "upside" indicates the direction of this side of the paper (+Z direction) of the semiconductor device 10 of FIG. 1. A "back surface" or a "lower surface" indicates a surface of the semiconductor device 10 of FIG. 1 which faces the other side of the paper (−Z direction) (the back surface is not illustrated in FIG. 1). Similarly, a "downside" indicates the direction of the other side of the paper (−Z direction) of the semiconductor device 10 of FIG. 1. A "side" indicates a surface of the semiconductor device 10 which connects the "front surface" or the "upper surface" and the "back surface" or the "lower surface". For example, a "side" indicates a surface of the semiconductor device 10 of FIG. 1 which faces the upside or the downside (±Y direction) or the left or the right (±X direction) on the paper. These terms mean the same directions as needed in the other drawings. The "front surface," the "upper surface," the "upside," the "back surface," the "lower surface," the "downside," and the "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction. Furthermore, in the following description a "main ingredient" indicates an ingredient contained at a rate of 80 volume percent (vol %) or more.

First Embodiment

Figure 1:
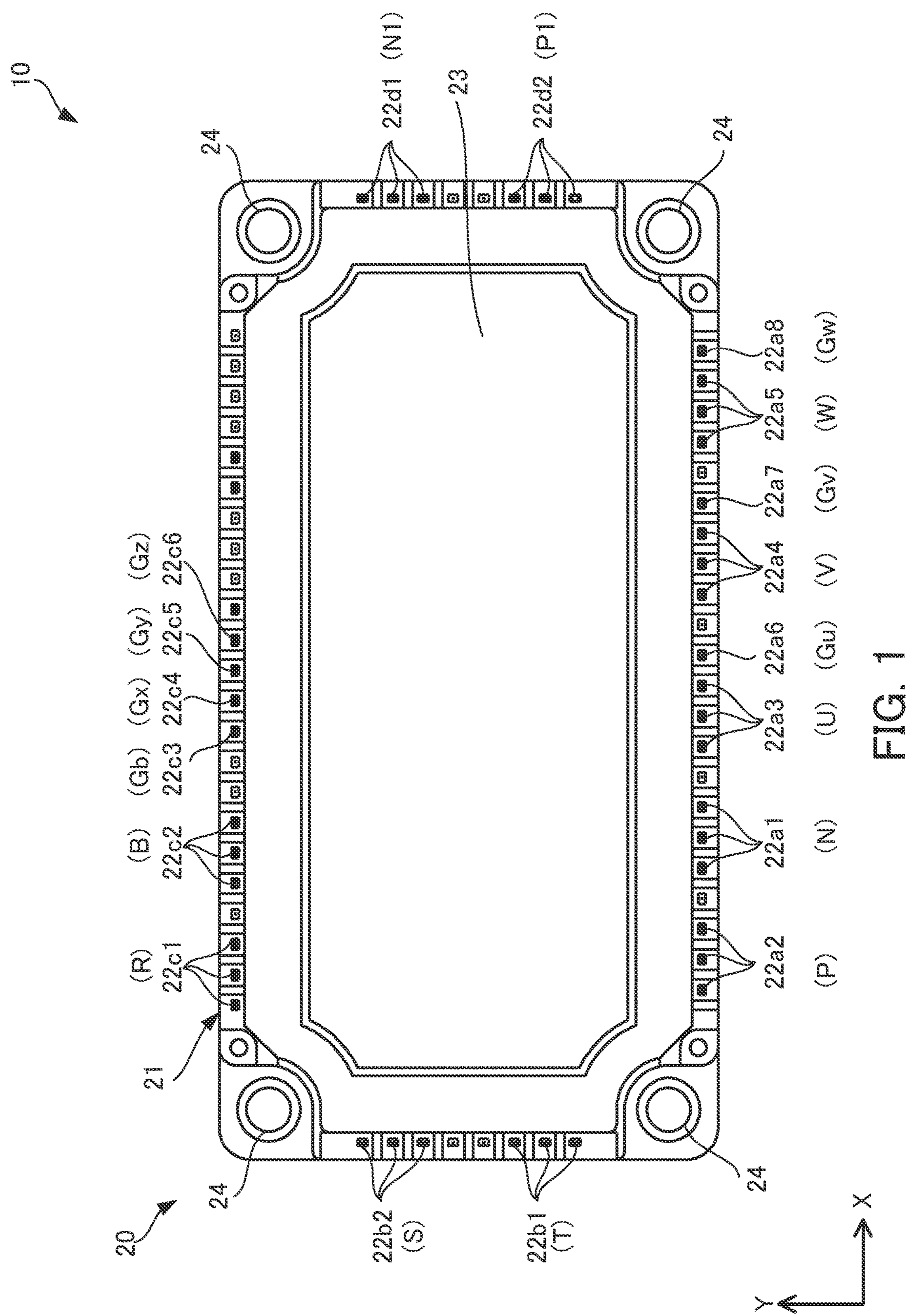
FIG. 1 is a plan view of a semiconductor device according to a first embodiment.
Figure 2:
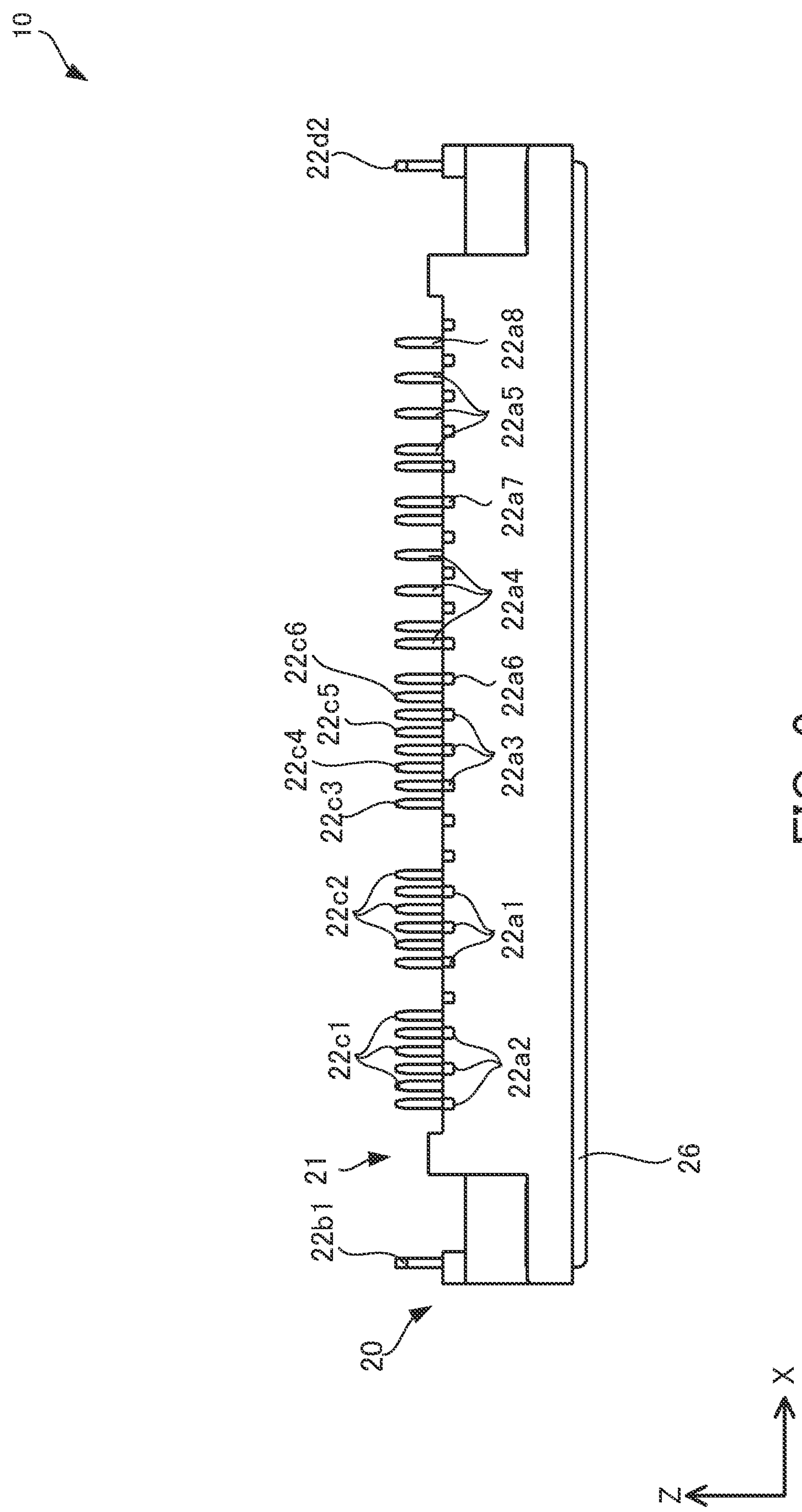
FIG. 2 is a side view of the semiconductor device according to the first embodiment.

A semiconductor device according to a first embodiment will now be described. First the external appearance of a semiconductor device will be described by the use of FIG. 1 and FIG. 2. FIG. 1 is a plan view of a semiconductor device according to a first embodiment. FIG. 2 is a side view of the semiconductor device according to the first embodiment. FIG. 2 illustrates a side at the time of viewing the semiconductor device 10 of FIG. 1 from the Y direction.

The semiconductor device 10 includes semiconductor elements (described later), such as diode elements and switching elements, ceramic circuit boards (described later), and a case 20 which houses the semiconductor elements and the ceramic circuit boards. Furthermore, a radiation plate 26 is exposed downward (in the −Z direction) from the back surface of the case 20 of the semiconductor device 10. The case 20 is rectangular in a plan view. The case 20 includes a side wall portion 21, a lid portion 23, and four fixing holes 24.

The side wall portion 21 is rectangular in the plan view. The side wall portion 21 has a housing portion (described later) in the center and the four sides of the housing portion are surrounded by a wall portion. Furthermore, a plurality of terminals are formed along a peripheral edge portion of the front surface of the side wall portion 21 so as to extend upward perpendicularly to the front surface of the side wall portion 21 (in the +Z direction). The plurality of terminals include P terminals 22*a*2, N terminals 22*a*1, R terminals 22*c*1, S terminals 22*b*2, and T terminals 22*b*1 which are external connection terminals of a converter circuit section described later. In addition, the plurality of terminals include P1 terminals 22*d*2, N1 terminals 22*d*1, U terminals 22*a*3, V terminals 22*a*4, W terminals 22*a*5, a Gu terminal 22*a*6, a Gv terminal 22*a*7, a Gw terminal 22*a*8, a Gx terminal 22*c*4, a Gy terminal 22*c*5, and a Gz terminal 22*c*6 which are external connection terminals of an inverter circuit section described later. Moreover, the plurality of terminals include B terminals 22*c*2 and a Gb terminal 22*c*3 which are external connection terminals of a brake circuit section described later. The details of the plurality of terminals will be described later.

The lid portion 23 is located so as to stop up an opening of the housing portion which houses the semiconductor elements and the like. The fixing holes 24 are made in the four corners of the side wall portion 21. Screws are inserted into the fixing holes 24. When the semiconductor device 10 is fixed to a determined place, the screws are inserted into the fixing holes 24 and the semiconductor device 10 is screwed to the determined place. The semiconductor device 10 is fixed in this way to the determined place.

The above case 20 and the plurality of terminals are integrally molded by the use of resin. Such resin contains a thermoplastic resin, such as polyphenylene sulfide resin, polybutylene terephthalate resin, polybutylene succinate resin, polyamide resin, or acrylonitrile butadiene styrene resin, as a main ingredient. Furthermore, the lid portion 23 is formed separately from the case 20 by the use of the same material.

For example, the radiation plate 26 is made of aluminum, iron, silver, copper, or an alloy containing at least one of them which has high thermal conductivity. Furthermore, in order to improve corrosion resistance, a material such as nickel may be formed on the surface of the radiation plate 26 by plating treatment or the like. To be concrete, a nickel-phosphorus alloy, a nickel-boron alloy, or the like may be used in place of nickel.

A cooler (not illustrated) may be fixed to the back surface of the radiation plate 26 to improve the heat dissipation property. The cooler is fixed to the back surface of the radiation plate 260 by screwing by the use of the fixing holes 24 or the cooler is bonded to the back surface of the radiation plate 26 with solder, silver solder, or the like therebetween. In this case, for example, the cooler is made of aluminum, iron, silver, copper, or an alloy containing at least one of them which has high thermal conductivity. Furthermore, a fin, a heat sink made up of a plurality of fins, a water-cooling cooler, or the like may be used as the cooler. In addition, the radiation plate 26 and the cooler may be integrally formed. In that case, the radiation plate 26 and the cooler are made of aluminum, iron, silver, copper, or an alloy containing at least one of them which has high thermal conductivity. Moreover, in order to improve corrosion resistance, a material such as nickel may be formed by plating treatment or the like on the surface of the radiation plate 26 integrally formed with the cooler. To be concrete, a nickel-phosphorus alloy, a nickel-boron alloy, or the like may be used in place of nickel.

Figure 3:
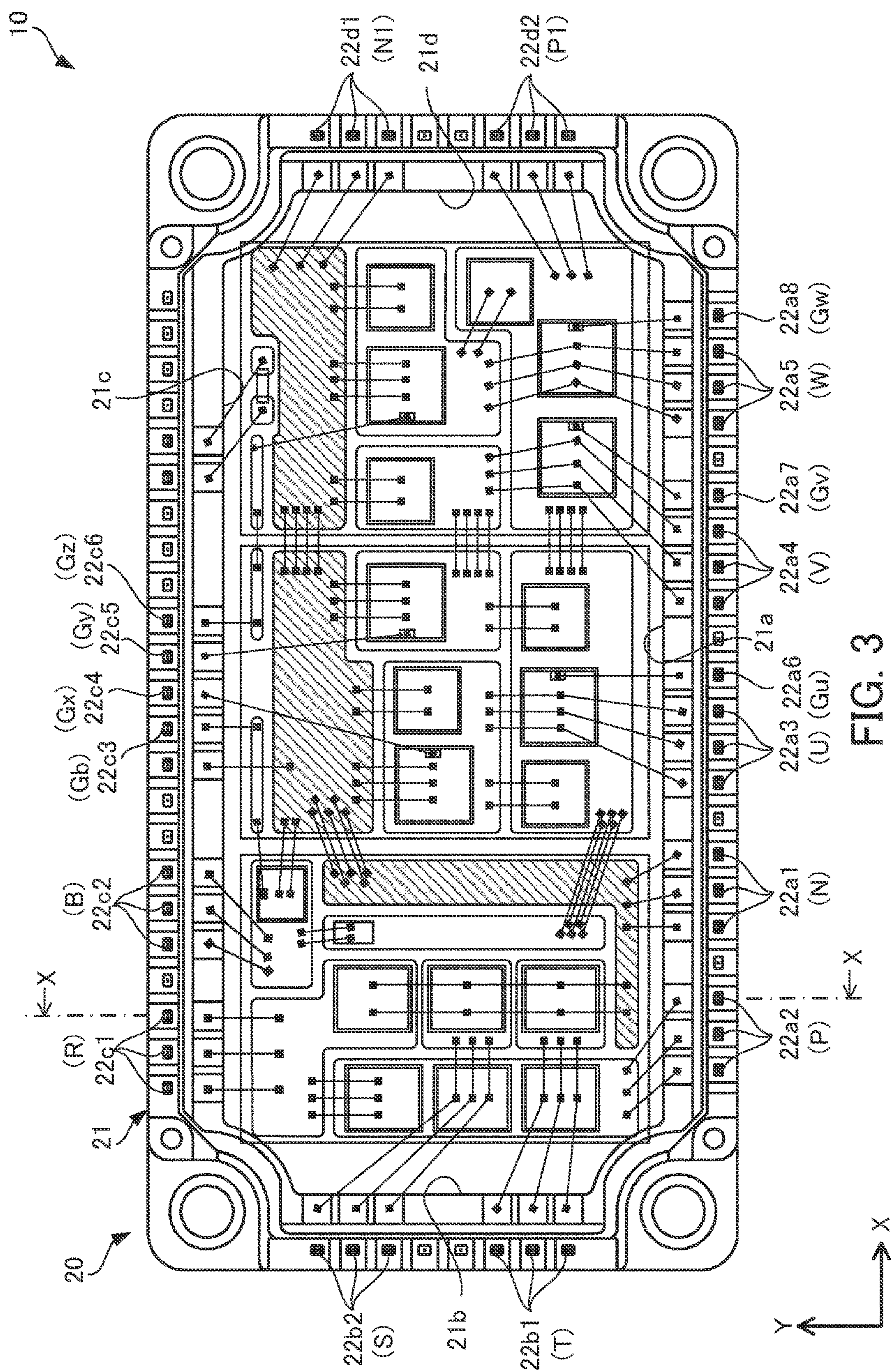
FIG. 3 is a plan view of the inside of the semiconductor device according to the first embodiment (part 1)
Figure 4:
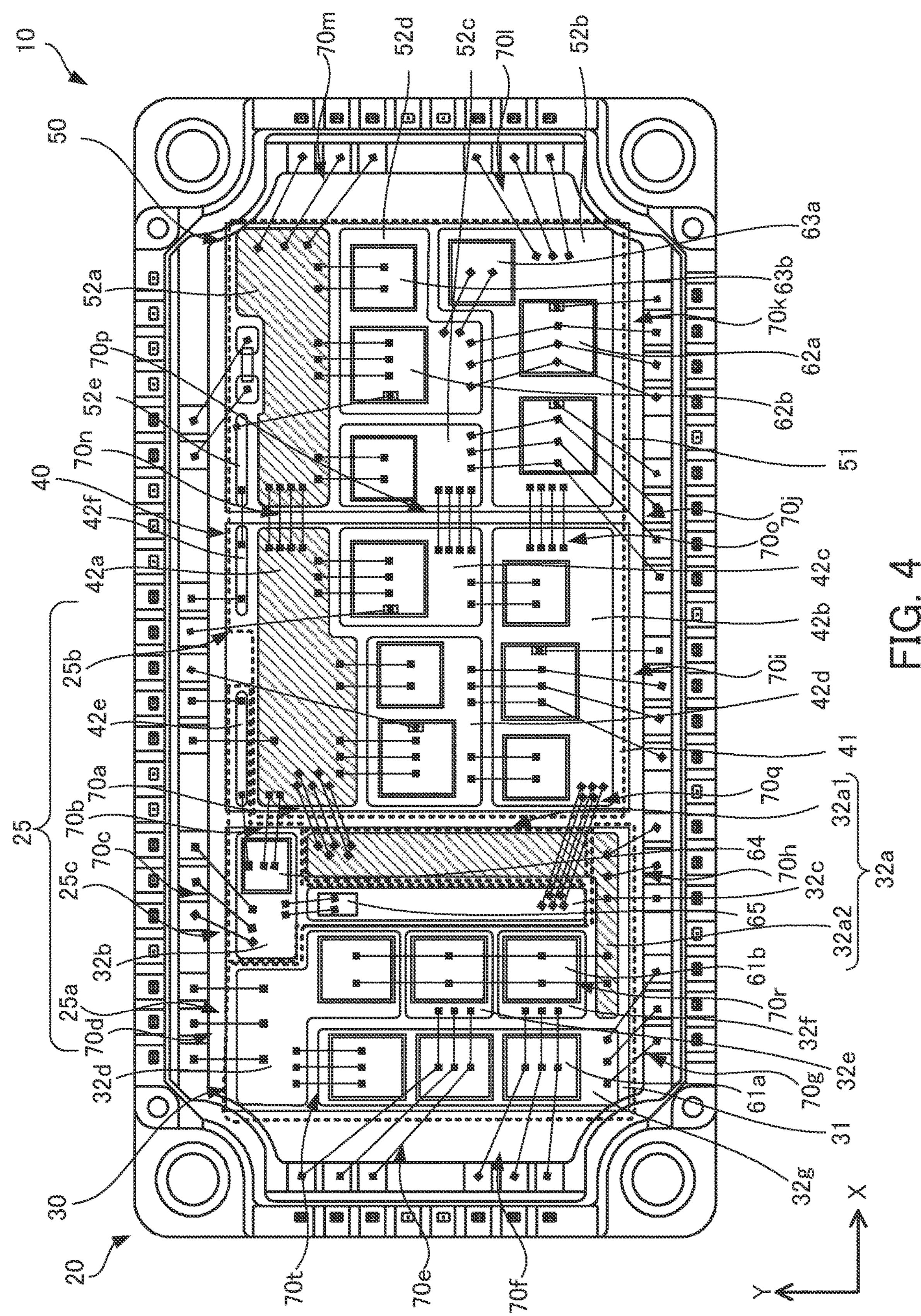
FIG. 4 is a plan view of the inside of the semiconductor device according to the first embodiment (part 2)
Figure 5:
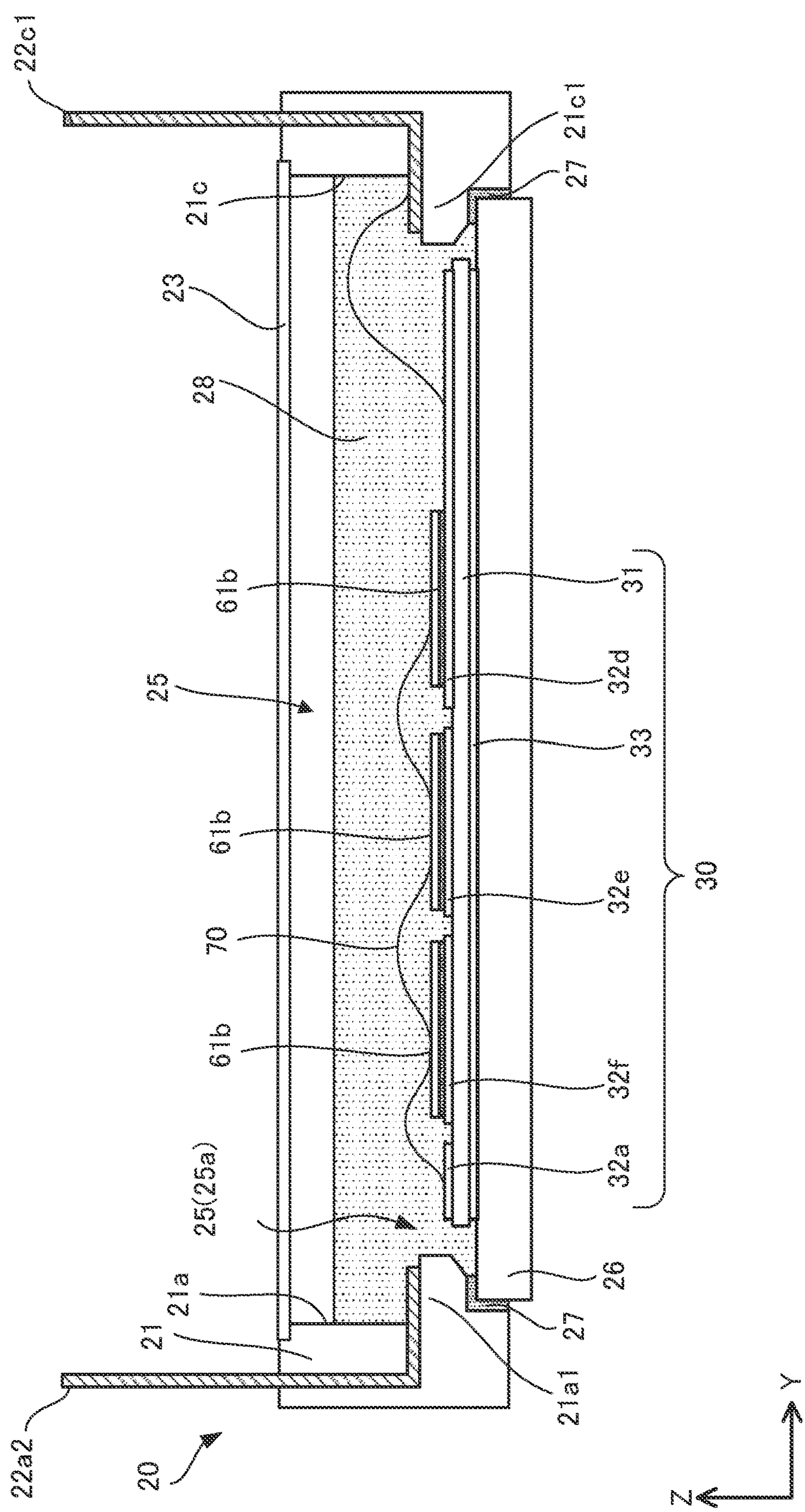
FIG. 5 is a sectional side elevation view of the semiconductor device according to the first embodiment.
Figure 6:
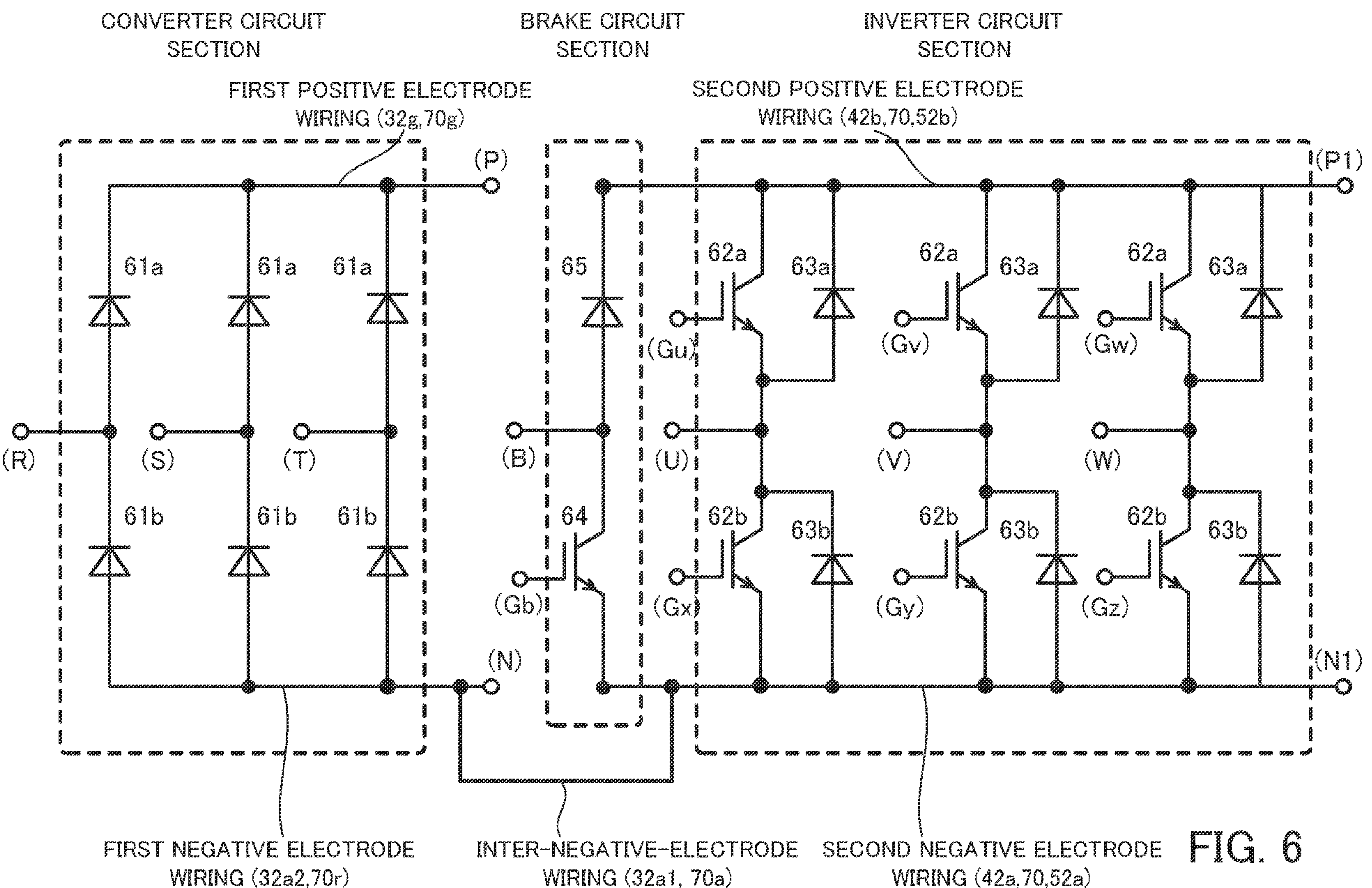
FIG. 6 is a circuit diagram illustrative of the circuit structure of the semiconductor device according to the first embodiment.

The structure of the inside of the semiconductor device 10 will now be described by the use of FIG. 3 through FIG. 6. FIGS. 3 and 4 are plan views of the inside of the semiconductor device according to the first embodiment. FIG. 5 is a sectional side elevation view of the semiconductor device according to the first embodiment. FIG. 6 is a circuit diagram illustrative of the circuit structure of the semiconductor device according to the first embodiment. FIGS. and 4 are the same drawings. In FIG. 3, components included in the case 20 are marked with numerals. In FIG. 4, components, such as the ceramic circuit boards 30, 40, 50 and the semiconductor elements (diode elements 61*a*, 61*b*, 63*a*, 63*b*, and 65, switching elements 62*a*, 62*b*, and 64), included in a housing portion (housing space) 25 of the case 20 are marked with numerals. Furthermore, in FIG. 4, only one of a plurality of diode elements 61*a*, 61*b*, 63*a*, 63*b*, and 65 is marked with a numeral. Similarly, only one of a plurality of switching elements 62*a*, 62*b*, and 64 is marked with a numeral. FIG. 5 is a sectional view taken along the dot-dash line X-X of FIG. 3. In addition, numerals with which a first positive electrode wiring (32*g*, 70*g*), a second positive electrode wiring (70*o*, 52*b*), a first negative electrode wiring (32*a*2), and a second negative electrode wiring (42*a*) illustrated in FIG. 6 are marked correspond to circuit patterns and wires which make up them.

As stated above, the semiconductor device 10 includes the case 20, and diode elements 61*a*, 61*b*, 63*a*, 63*b*, and 65, switching elements 62*a*, 62*b*, and 64, and ceramic circuit boards 30, 40, and 50 housed in the case 20. Hereinafter the diode elements 61*a*, 61*b*, 63*a*, 63*b*, and 65 and the switching elements 62*a*, 62*b*, and 64 may be referred to in block as semiconductor elements. Furthermore, in FIG. 3 and FIG. 4, a sealing member 28 with which the housing portion 25 is sealed and the lid portion 23 are not illustrated.

As illustrated in FIG. 3 and FIG. 4, the side wall portion 21 of the case 20 has the shape of a rectangular frame in a plan view and includes a first wall 21*a*, a second wall 21*b*, a third wall 21*c*, and a fourth wall 21*d*. The third wall 21*c* is disposed on the +Y side with respect to the first wall 21*a* and faces the first wall 21*a*. Furthermore, the fourth wall 21*d* is disposed on the +X side with respect to the second wall 21*b* and faces the second wall 21*b*. The first wall 21*a* and the third wall 21*c* may be long sides and the second wall 21*b* and the fourth wall 21*d* may be short sides. In addition, the side wall portion 21 need only have the straight first wall 21*a* through fourth wall 21*d* on the four sides of the rectangle. The side wall portion 21 may have curved line (curved surface) portions in the corners. The case 20 includes the housing portion 25 surrounded by the side wall portion 21.

As illustrated in FIG. 5, the sealing member 28 is disposed in the housing portion 25 of the case 20. The sealing member 28 seals the front surfaces of the ceramic circuit boards 30, 40, and 50 (FIG. 5 illustrates the ceramic circuit board 30), the semiconductor elements such as the diode elements 61*b*, and wires 70. In this connection, some specific wires are marked with different numerals, and the other wires are marked with a numeral 70. The sealing member 28 used in the housing portion 25 of the case 20 contains a thermosetting resin and a filling material contained in a thermosetting resin. A thermosetting resin is epoxy resin, phenolic resin, maleimide resin, or the like. An example of the sealing member 28 is epoxy resin containing a filling material. An inorganic material, such as silicon oxide, aluminum oxide, boron nitride, or aluminum nitride, is used as a filling material. Furthermore, the sealing member 28 may be silicone gel.

As illustrated in FIG. 6, the semiconductor device 10 includes at least a converter circuit section and an inverter circuit section. Furthermore, the semiconductor device 10 may include a brake circuit section. The converter circuit section converts an alternating current (AC) to a direct current (DC). The converter circuit section converts by the diode elements 61*a* and 61*b* a three-phase AC current inputted from an external AC power source to an R terminal, an S terminal, and a T terminal and outputs it as a DC current from a high-potential P terminal and a low-potential N terminal. The inverter circuit section converts a DC to an AC. The inverter circuit section converts by the switching elements 62*a* and 62*b* and the diode elements 63*a* and 63*b* a DC current inputted from a high-potential P1 terminal and a low-potential N1 terminal and outputs it as a three-phase AC current from a U terminal, a V terminal, and a W terminal. The brake circuit section causes an external resistor to consume regenerated power. The brake circuit section outputs power regenerated from the high-potential P1 terminal and the low-potential N1 terminal from a B terminal for a brake output via the switching element 64 and the diode element 65. In addition, a first negative electrode wiring (wiring connected to an N terminal), which is a low potential side wiring of the converter circuit section, and a second negative electrode wiring (wiring connected to the N1 terminal), which is a low potential side wiring of the inverter circuit section, are electrically connected by an inter-negative-electrode wiring.

As illustrated in FIG. 3, external connection terminals of a converter circuit section 25*a* are formed on the side where the second wall 21*b* is provided (the −X side, on the side wall portion 21. To be concrete, the P terminals 22*a*2 (first positive electrode terminals) and the N terminals 22*a*1 (first negative electrode terminals) are formed on the first wall 21*a* near the second wall 21*b* (on the −X side). The R terminals 22*c*1 are formed on the third wall 21*c* near the second wall 21*b* (on the −X side). Furthermore, the S terminals 22*b*2 and the T terminals 22*b*1 are formed on the second wall 21*b*. To form the external connection terminals of the converter circuit section 25*a* in this way on one side makes it easy to connect an external device and the converter circuit section 25*a*. In addition, a side wall on which the P terminals 22*a*2 (first positive electrode terminals) and the N terminals 22*a*1 (first negative electrode terminals) are disposed, a side wall on which the R terminals 22*c*1 are disposed, and a side wall on which the S terminals 22*b*2 and the T terminals 22*b*1 are disposed differ from one another. The P terminals 22*a*2 (first positive electrode terminals) and the N terminals 22*a*1 (first negative electrode terminals) are formed on the first wall 21*a* and arranged in this order in a direction from the second wall 21*b* toward the fourth wall 21*d*. Accordingly, the P terminals 22*a*2 (first positive electrode terminals) are disposed nearer to the R terminals 22*c*1, the S terminals 22*b*2, and the T terminals 22*b*1 than the N terminals 22*a*1 (first negative electrode terminals). As a result, the high potential side and low potential side of the converter circuit section 25*a* are easily wired in the housing portion 25 and an external device and the converter circuit section 25*a* are easily connected.

Furthermore, external connection terminals of an inverter circuit section 25*b* are formed on the side where the fourth wall 21*d* is provided (on the +x side), on the side wall portion 21. To be concrete, the N1 terminals 22*d*1 (second negative electrode terminals) and the P1 terminals 22*d*2 (second positive electrode terminals) are formed on the fourth wall 21*d* and arranged in this order in a direction from the third wall 21*c* toward the first wall 21*a*. In addition, the U terminals 22*a*3, the V terminals 22*a*4, and the W terminals 22*a*5, which are output terminals, are formed on the first wall 21*a* near the fourth wall 21*d* (on the +X side). Moreover, the Gu terminal 22*a*6, the Gv terminal 22*a*7, and the Gw terminal 22*a*8, which are control terminals, are formed between the output terminals on the first wall 21*a*. Furthermore, the Gx terminal 22*c*4, the Gy terminal 22*c*5, and the Gz terminal 22*c*6, which are control terminals, are formed on the third wall 21*c* near the fourth wall 21*d* (on the +X side) and arranged in this order in a direction from the second wall 21*b* toward the fourth wall 21*d*. To form the external connection terminals of the inverter circuit section 25*b* in this way on one side makes it easy to connect an external device and the inverter circuit section 25*b*. In addition, the fourth wall 21*d* on which the P1 terminals 22*d*2 (second positive electrode terminals) and the N1 terminals 22*d*1 (second negative electrode terminals) are disposed and the first wall 21*a* on which the U terminals 22*a*3, the V terminals 22*a*4, and the W terminals 22*a*5 are disposed differ from each other. The N1 terminals 22*d*1 (second negative electrode terminals) and the P1 terminals 22*d*2 (second positive electrode terminals) are formed on the fourth wall 21*d* and arranged in this order in a direction from the third wall 21*c* toward the first wall 21*a*. Accordingly, the P1 terminals 22*d*2 (second positive electrode terminals) are disposed nearer to the U terminals 22*a*3, the V terminals 22*a*4, and the W terminals 22*a*5 than the N1 terminals 22*d*1 (second negative electrode terminals). As a result, the high potential side and low potential side of the inverter circuit section 25*b* are easily wired in the housing portion 25 and an external device and the inverter circuit section 25*b* are easily connected.

Moreover, the B terminals 22*c*2 and the Gb terminal 22*c*3, which are external connection terminals of a brake circuit section 25*c*, are formed on the side wall portion 21 between the external connection terminals of the converter circuit section 25*a* on the side where the second wall 21*b* is provided (on the −X side) and the external connection terminals of the inverter circuit section 25*b* on the side where the fourth wall 21*d* is provided (on the +X side). To be concrete, the B terminals 22*c*2 and the Gb terminal 22*c*3 are formed on the third wall 21*c* between the R terminals 22*c*1, which are external connection terminals of the converter circuit section 25*a*, and the Gx terminal 22*c*4, the Gy terminal 22*c*5, and the Gz terminal 22*c*6, which are external connection terminals of the inverter circuit section 25*b*.

Furthermore, as illustrated in FIG. 5, the housing portion 25 of the case 20 is perforated in the vertical direction (in the ±Z direction). Each of the first wall 21*a*, the second wall 21*b*, the third wall 21*c*, and the fourth wall 21*d* includes a protruding area which protrudes toward the housing portion 25. FIG. 5 illustrates a protruding area 21*a*1 of the first wall 21*a* and a protruding area 21*c*1 of the third wall 21*c*. The radiation plate 26 is stuck from the back surface side of the case 20 with an adhesive 27. More specifically, the radiation plate 26 is stuck on the back surfaces of the protruding area 21*a*1 and the protruding area 21*c*1 in the housing portion 25 with the adhesive 27. The ceramic circuit boards 30, 40, and 50 described later are disposed over the radiation plate 26. FIG. 5 illustrates the ceramic circuit board 30. In addition, the P terminals 22*a*2 and the R terminals 22*c*1 have the shape of the letter "L" in a side view and are buried in the first wall 21*a* and the third wall 21*c*, respectively. Moreover, one end portion of each of the P terminals 22*a*2 and the R terminals 22*c*1 vertically extends upward (in the +Z direction) from the front surface of the case 20. The other end portion of each of the P terminals 22*a*2 and the R terminals 22*c*1 is vertically exposed upward (in the +Z direction) on the protruding area 21*a*1 of the first wall 21*a* and the protruding area 21*c*1 of the third wall 21*c*. Similarly, a plurality of terminals other than the P terminals 22*a*2 and the R terminals 22*c*1 are also molded integrally with the first wall 21*a*, the second wall 21*b*, the third wall 21*c*, and the fourth wall 21*d*.

The above plurality of terminals are made of copper, aluminum, iron, or an alloy containing at least one of them which has good electrical conductivity. Furthermore, in order to improve corrosion resistance, nickel, gold, tin, an alloy containing at least one of them, or the like may be formed on the surface of each of the plurality of terminals by plating treatment or the like.

As illustrated in FIG. 4, the ceramic circuit boards 30, 40, and 50 are rectangular in a plan view. The ceramic circuit boards 30, 40, and 50 are disposed in order in a direction from the second wall 21*b* to the fourth wall 21*d* over the radiation plate 26 in the housing portion 25. The ceramic circuit boards 30, 40, and 50 include ceramic boards 31, 41, and 51 and metal plates (FIG. 5 illustrates only a metal plate 33) formed on the back surfaces thereof respectively. Furthermore, the ceramic circuit boards 30, 40, and 50 include circuit patterns (first circuit patterns) 32*a* through 32*g*, circuit patterns (second circuit patterns) 42*a* through 42*f*, and circuit patterns (third circuit patterns) 52*a* through 52*e* formed over the front surfaces of the ceramic boards 31, 41, and 51 respectively. The ceramic boards 31, 41, and 51 and the metal plates are rectangular in planar view. In addition, corner portions of the ceramic boards 31, 41, and 51 and the metal plates formed on the back surfaces thereof may be R-chamfered or C-chamfered. The size of the metal plates is smaller in the plan view than that of the ceramic boards 31, 41, and 51 and the metal plates are formed inside the ceramic boards 31, 41, and 51 respectively.

Each of the ceramic boards 31, 41, and 51 contains as a main ingredient a ceramic having high thermal conductivity. A ceramic contained in the ceramic boards 31, 41, and 51 is made of a material containing aluminum oxide, aluminum nitride, silicon nitride, or the like as a main ingredient. Furthermore, the thickness of the ceramic boards 31, 41, and 51 is greater than or equal to 0.2 mm and smaller than or equal to 2.5 mm.

Each of the metal plates contains as a main ingredient metal, such as copper, aluminum, or an alloy containing at least one of them, having high thermal conductivity. In addition, the thickness of the metal plates is greater than or equal to 0.1 mm and smaller than or equal to 5.0 mm. In order to improve corrosion resistance, plating treatment may be performed on the surfaces of the metal plates. At this time nickel, a nickel-phosphorus alloy, a nickel-boron alloy, or the like is used as a plating material.

Each of the circuit patterns 32*a* through 32*g*, 42*a* through 42*f*, and 52*a* through 52*e* contains as a main ingredient metal, such as copper, aluminum, or an alloy containing at least one of them, having good electrical conductivity. Furthermore, the thickness of the circuit patterns 32*a* through 32*g*, 42*a* through 42*f*, and 52*a* through 52*e* is greater than or equal to 0.1 mm and smaller than or equal to 5.0 mm. In order to improve corrosion resistance, plating treatment may be performed on the surfaces of the circuit patterns 32*a* through 32*g*, 42*a* through 42*f*, and 52*a* through 52*e*. At this time nickel, a nickel-phosphorus alloy, a nickel-boron alloy, or the like is used as a plating material. The circuit patterns 32*a* through 32*g*, 42*a* through 42*f*, and 52*a* through 52*e* are obtained by forming a metal layer over the front surfaces of the ceramic boards 31, 41, and 51 and performing treatment, such as etching, on the metal layer. Alternatively, the circuit patterns 32*a* through 32*g*, 42*a* through 42*f*, and 52*a* through 52*e* cut in advance out of a metal layer may be pressure-bonded to the front surfaces of the ceramic boards 31, 41, and 51 respectively. The circuit patterns 32*a* through 32*g*, 42*a* through 42*f*, and 52*a* through 52*e* illustrated in FIG. 3 and FIG. 4 are taken as an example. The details of the circuit patterns 32*a* through 32*g*, 42*a* through 42*f*, and 52*a* through 52*e* will be described later.

Direct copper bonding (DCB) substrates, active metal brazed (AMB) substrates, or the like may be used as the ceramic circuit boards 30, 40, and 50 each having the above structure. The ceramic circuit boards 30, 40, and 50 transfer via the circuit patterns 32*a* through 32*g*, 42*a* through 42*f*, and 52*a* through 52*e*, the ceramic boards 31, 41, and 51, and the metal plate, respectively, heat generated by semiconductor elements to the outside.

Each of the diode elements 61*a*, 61*b*, 63*a*, 63*b*, and 65 contains silicon or silicon carbide as a main ingredient. Each of the diode elements 61*a*, 61*b*, 63*a*, 63*b*, and 65 is a Schottky barrier diode (SBD), a P-intrinsic-N (PiN) diode, or the like. Each of the diode elements 61*a*, 61*b*, 63*a*, 63*b*, and 65 has a cathode electrode as a main electrode on the back surface and has an anode electrode as a main electrode on the front surface. The back surfaces of the above diode elements 61*a*, 61*b*, 63*a*, 63*b*, and 65 are bonded to the circuit patterns (numerals are omitted) with solder (not illustrated).

Each of the switching elements 62*a*, 62*b*, and 64 contains silicon or silicon carbide as a main ingredient. Each of the switching elements 62*a*, 62*b*, and 64 is an IGBT, a power MOSFET, or the like. If each of the switching elements 62*a*, 62*b*, and 64 is an IGBT, then it has an input electrode (collector electrode) as a main electrode on the back surface and has a gate electrode as a control electrode and an output electrode (emitter electrode) as a main electrode on the front surface. If each of the switching elements 62*a*, 62*b*, and 64 is a power MOSFET, then it has an input electrode (drain electrode) as a main electrode on the back surface and has a gate electrode as a control electrode and an output electrode (source electrode) as a main electrode on the front surface. In this embodiment a case where each of the switching elements 62*a*, 62*b*, and 64 is an IGBT is described. The back surfaces of the above switching elements 62*a*, 62*b*, and 64 are bonded to the circuit patterns with solder (not illustrated).

Furthermore, a reverse-conducting (RC)-IGBT having both the functions of an IGBT and a free wheeling diode (FWD) may be used in place of the diode element 63*a* and the switching element 62*a* or the diode element 63*b* and the switching element 62*b*. In addition, electronic parts, such as a resistor, a condenser, and a thermistor, may properly be mounted according to the design, specification, or the like of the semiconductor device 10.

The plurality of diode elements 61*a* and 61*b* included in the converter circuit section 25*a* are placed on the side where the second wall 21*b* is provided (on the −X side) in the housing portion 25. To be concrete, the three diode elements 61*a* on the high potential side are bonded to the circuit pattern 32*g* and are disposed in line on a side nearest the second wall 21*b*. The three diode elements 61*b* on the low potential side are bonded to the circuit patterns (input wiring) 32*f*, 32*e*, and 32*d*, respectively, and are disposed in line on a side second nearest the second wall 21*b*.

The plurality of switching elements 62*a* and 62*b* and the plurality of diode elements 63*a* and 63*b* included in the inverter circuit section 25*b* are placed on the side where the fourth wall 21*d* is provided (on the +X side) in the housing portion 25. To be concrete, the three switching elements 62*a* and the three diode elements 63*a* on the high potential side are bonded to the circuit patterns 42*b* and 52*b* and are disposed in line on the side where the fourth wall 21*d* is provided (on the +X side) and on a side near the first wall 21*a*. The three switching elements 62*b* and the three diode elements 63*b* on the low potential side are bonded to the circuit patterns (output wiring) 42*c*, 42*d*, 52*c*, and 52*d* and are disposed in line on the side where the fourth wall 21*d* is provided (on the +X side) and on a side which is nearer to the third wall 21*c* than the switching elements 62*a* and the diode elements 63*a* on the high potential side.

The switching element 64 and the diode element 65 included in the brake circuit section 25*c* are bonded to the circuit patterns 32*b* and 32*c*, respectively, and are disposed in the housing portion 25 between the converter circuit section 25*a* on the side where the second wall 21*b* is provided (on the −X side) and the inverter circuit section 25*b* on the side where the fourth wall 21*d* (on the +X side) is provided.

Furthermore, the first negative electrode wiring, which is a low potential wiring of the converter circuit section 25*a*, and the second negative electrode wiring, which is a low potential wiring of the inverter circuit section 25*b*, are electrically connected by the inter-negative-electrode wiring. In FIG. 4, the first negative electrode wiring includes a horizontally extending area (first negative electrode wiring) 32*a*2 included in the circuit pattern (first negative electrode circuit pattern) 32*a*. The horizontally extending area 32*a*2 is an area of the circuit pattern 32*a* opposite the first wall 21*a*. In addition, the second negative electrode wiring corresponds to the circuit patterns 42*a* and 52*a* and wires 70*n* connecting the circuit patterns 42*a* and 52*a*. Moreover, the inter-negative-electrode wiring includes a vertically extending area (first extending portion) 32*a*1 included in the circuit pattern 32*a* and wires 70*a*. The vertically extending area 32*a*1 is an area of the circuit pattern 32*a* which extends from an end portion of the horizontally extending area 32*a*2 on the side where the fourth wall 21*d* is provided in a direction from the first wall 21*a* toward the third wall 21*c*. The wires 70*a* are wired from an end portion of the circuit pattern 32*a* on the side where the third wall 21*c* is provided to an end portion of the circuit pattern (second negative electrode circuit pattern) 42*a* on the side where the second wall 21*b* is provided. The circuit pattern 42*a* may correspond to a second extending portion.

The circuit pattern 32*a* has the shape of the letter "L" in a plan view. The circuit pattern 32*a* includes the horizontally extending area 32*a*2 extending in the horizontal direction (in the X direction) of the shape of the letter "L". The horizontally extending area 32*a*2 is included in the first negative electrode wiring. Furthermore, the circuit pattern 32*a* includes the vertically extending area 32*a*1 extending in the vertical direction (in the Y direction) of the shape of the letter "L". The vertically extending area 32*a*1 is included in the inter-negative-electrode wiring. The vertically extending area 32*a*1 does not extend until the vertically extending area 32*a*1 gets closer to the third wall 21*c* than the circuit pattern 42*a* but extends halfway along the circuit pattern 42*a* in the plan view. Alternatively, the vertically extending area 32*a*1 may extend up to a point just before the circuit pattern 42*a*.

Solder used for bonding the semiconductor elements and the circuit patterns is Pb-free solder. For example, Pb-free solder contains at least one of a tin-silver-copper alloy, a tin-zinc-bismuth alloy, a tin-copper alloy, and a tin-silver-indium-bismuth alloy as a main ingredient. Furthermore, the solder may contain an additive. A sintered metal body may be used in place of the solder. A material for a sintered metal body contains silver or a silver alloy as a main ingredient.

As illustrated in FIG. 4, the ceramic circuit boards 30, 40, and 50 and the semiconductor elements are housed in the housing portion 25 of the case 20 surrounded by the side wall portion 21. The circuit patterns, the semiconductor elements, and the plurality of terminals are connected electrically and mechanically by the wires 70. As a result, the converter circuit section 25*a*, the inverter circuit section 25*b*, and the brake circuit section 25*c* each of which is indicated in FIG. 4 by an area enclosed by a dashed line are included in the housing portion 25. The wires 70 contain as a main ingredient metal, such as gold, silver, copper, aluminum, or an alloy containing at least one of them, having good electrical conductivity. The diameter of wires 70 connected to the control electrodes of the switching elements may be made smaller than that of the other wires 70. This makes bonding area small and makes wiring to minute portions easy. For example, the diameter of the wires 70 for control is greater than or equal to 50 μm and smaller than or equal to 250 μm. The diameter of the other wires 70 is greater than or equal to 300 μm and smaller than or equal to 600 μm.

In FIG. 6, the converter circuit section 25*a* is represented by circuit structure indicated in a left area. Furthermore, in FIG. 4, the converter circuit section 25*a* is formed over the ceramic circuit board 30 and is disposed on the side where the second wall 21*b* is provided (on the −X side). The converter circuit section 25*a* includes the circuit pattern 32*a* (horizontally extending area 32*a*2) and wires 70*r* for connecting the diode element 61*b* and the circuit pattern 32*a* (horizontally extending area 32*a*2), which make up the first negative electrode wiring. An AC current inputted to the converter circuit section 25*a* flows from the R terminals 22*c*1 through wires 70*d*, the circuit pattern 32*d*, and wires 70*t* to the anode electrode on the front surface of the diode element 61*a*. In addition, an AC current inputted to the converter circuit section 25*a* flows from the T terminals

**22*b*1 through wires 70*f* to the anode electrode on the front surface of the diode element 61*a*. An AC current inputted to the converter circuit section 25*a* flows from the S terminals 22*b*2 through wires 70*e* to the anode electrode on the front surface of the diode element 61*a*. Moreover, the AC current inputted in this way is rectified by the plurality of diode elements 61*a*. A current obtained by the rectification is outputted from the cathode electrodes on the back surfaces of the diode elements 61*a* through the circuit pattern 32*g* and wires 70*g*, which make up a first positive electrode wiring, to the P terminals 22*a*2** on the high potential side.

Furthermore, the AC current inputted to the converter circuit section **25*a* flows from the R terminals 22*c*1 through the wires 70*d* and the circuit pattern 32*d* to the cathode electrode on the back surface of the diode element 61*b*. In addition, the AC current inputted to the converter circuit section 25*a* flows from the S terminals 22*b*2 through wires 70*e* and the circuit pattern 32*e* to the cathode electrode on the back surface of the diode element 61*b*. The AC current inputted to the converter circuit section 25*a* flows from the T terminals 22*b*1 through wires 70*f* and the circuit pattern 32*f* to the cathode electrode on the back surface of the diode element 61*b*. Moreover, the AC current inputted is rectified by the plurality of diode elements 61*b*. A current obtained by the rectification is outputted from the anode electrodes on the front surfaces of the diode elements 61*b* through the wires 70*r*, the horizontally extending area 32*a*2 of the circuit pattern 32*a*, and wires 70*h*, which make up the first negative electrode wiring, to the N terminals 22*a*1 on the low potential side. In FIG. 4, the horizontally extending area 32*a*2 of the circuit pattern 32*a* included in the first negative electrode wiring is disposed on the side where the first wall 21*a*** is provided.

In FIG. 6, the inverter circuit section **25*b* is represented by circuit structure indicated in a right area. Furthermore, as illustrated in FIG. 4, the inverter circuit section 25*b* is formed over the ceramic circuit boards 40 and 50 and is disposed on the side where the fourth wall 21*d* is provided (on the +X side). The inverter circuit section 25*b* includes the circuit patterns 42*a* and 52*a* and wires 70*n* for connecting the circuit patterns 42*a* and 52*a*, which make up the second negative electrode wiring. With the above inverter circuit section 25*b* connections are made from the P1 terminals 22*d*2 on the high potential side through wires 70*l* and the circuit pattern 52*b* included in the second positive electrode wiring to the input electrode on the back surface of the switching element 62*a* included in an upper arm and the cathode electrode on the back surface of the diode element 63*a* included in the upper arm. In addition, connections are made from the circuit pattern 52*b* through wires 70*o* and the circuit pattern 42*b* included in the second positive electrode wiring to the input electrode on the back surface of another switching element 62*a* included in the upper arm and the cathode electrode on the back surface of another diode element 63*a* included in the upper arm. Moreover, the output electrodes on the front surfaces of the plurality of switching elements 62*a* are connected through wires 70*i*, 70*j*, and 70*k* to the U terminals 22*a*3, the V terminals 22*a*4, and the W terminals 22*a*5, which are AC terminals. Furthermore, the anode electrodes on the front surfaces of the diode elements 63*a* are connected through wires 70, the circuit patterns 42*c*, 42*d*, 52*c*, and 52*d*, and wires 70*i*, 70*j*, and 70*k* connected to the output electrodes on the front surfaces of the plurality of switching elements 62*a* to the U terminals 22*a*3, the V terminals 22*a*4, and the W terminals 22*a*5**, which are AC terminals.

In addition, the U terminals **22*a*3, the V terminals 22*a*4, and the W terminals 22*a*5 of the inverter circuit section 25*b*, which are AC terminals, are connected through wires 70*i*, 70*j*, and 70*k* and the circuit patterns 42*c*, 42*d*, 52*c*, and 52*d* to the input electrodes on the back surfaces of the plurality of switching elements 62*b* included in a lower arm and the cathode electrode on the back surfaces of the plurality of diode elements 63*b* included in the lower arm. Moreover, the output electrodes on the front surfaces of the switching elements 62*b* and the anode electrode on the front surfaces of the diode elements 63*b* are connected through wires 70 to the circuit patterns 42*a* and 52*a*, the wires 70*n* for connecting the circuit patterns 42*a* and 52*a*, and wires 70*m* for connecting the circuit pattern 52*a* and the N1 terminals 22*d*1 on the low potential side, which make up the second negative electrode wiring. Furthermore, the output electrodes on the front surfaces of the switching elements 62*b* and the anode electrode on the front surfaces of the diode elements 63*b* are connected through the second negative electrode wiring to the N1 terminals 22*d*1 on the low potential side. In FIG. 4, the circuit patterns 42*a* and 52*a* included in the second negative electrode wiring are disposed on the side where the third wall 21*c* is provided so as to extend in a direction from the fourth wall 21*d* toward the second wall 21*b***.

The Gu terminal **22*a*6, the Gv terminal 22*a*7, and the Gw terminal 22*a*8, which are gate terminals of the inverter circuit section 25*b*, are connected through wires 70 to the gate electrodes of the switching elements 62*a*, respectively, included in the upper arm. Furthermore, the Gx terminal 22*c*4 and the Gy terminal 22*c*5 are connected through wires 70 to the gate electrodes of the switching elements 62*b*, respectively, included in the lower arm. The Gz terminal 22*c*6 is connected through wires 70 and the circuit patterns 42*f* and 52*e* to the gate electrode of the switching element 62*b*** included in the lower arm.

In FIG. 6, the brake circuit section **25*c* is represented by circuit structure indicated in an area between the converter circuit section 25*a* and the inverter circuit section 25*b*. Furthermore, as illustrated in FIG. 4, the brake circuit section 25*c* is formed over the ceramic circuit board 30 on the side where the ceramic circuit board 40 is provided (on the +X side) and is disposed over an area between the converter circuit section 25*a* and the inverter circuit section 25*b*. A positive electrode wiring of the brake circuit section 25*c* is electrically connected to the second positive electrode wiring of the inverter circuit section 25*b*. To be concrete, the positive electrode P1 terminals 22*d*2 are connected through the second positive electrode wiring of the inverter circuit section 25*b* and wires 70 connected to the second positive electrode wiring and the circuit pattern 32*c* to the circuit pattern 32*c* of the brake circuit section 25*c* and the cathode electrode on the back surface of the diode element 65 of the brake circuit section 25*c*. Furthermore, a negative electrode wiring of the brake circuit section 25*c* is electrically connected to the second negative electrode wiring of the inverter circuit section 25*b*. To be concrete, the negative electrode N1 terminals 22*d*1 is connected through the second negative electrode wiring of the inverter circuit section 25*b* and wires 70*b* connected from the second negative electrode wiring to the switching element 64 to the output electrode on the front surface of the switching element 64 of the brake circuit section 25*c*. In addition, the B terminals 22*c*2 are connected through wires 70*c* and the circuit pattern 32*b* to the input electrode on the back surface of the switching element 64 and are connected through the wires 70, the circuit pattern 32*b*, and wires 70 to the anode electrode on the front surface of the diode element 65. Moreover, the Gb terminal 22c3, which is a control terminal of the brake circuit section 25c, is connected through a wire 70, the circuit pattern 42e, and a wire 70 to the gate electrode of the switching element 64**.

With the semiconductor device 10 having the above circuit structure, the circuit pattern 42a, which is the second negative electrode wiring, and the horizontally extending area 32a2 of the circuit pattern 32a, which is the first negative electrode wiring, are connected electrically and mechanically by the vertically extending area 32a1 of the circuit pattern 32a and the wires 70a, which are the inter-negative-electrode wiring. As a result, the N terminals 22a1 and the N1 terminals 22d1 are electrically connected in the semiconductor device 10 and are equal in potential.

Furthermore, as illustrated in FIG. 4, the first negative electrode wiring is disposed near the second wall 21b on the side where the first wall 21a is provided, and the second negative electrode wiring is disposed near the fourth wall 21d on the side where the third wall 21c is provided. In addition, the inter-negative-electrode wiring extends in a direction from the first wall 21a toward the third wall 21c between the converter circuit section 25a near the second wall 21b and the inverter circuit section 25b near the fourth wall 21d. That is to say, the second negative electrode wiring and the inter-negative-electrode wiring are disposed so as to form the shape of the letter "L" in a plan view. Moreover, the first negative electrode wiring and the inter-negative-electrode wiring are disposed so as to form the shape of the letter "L" in the plan view. Furthermore, the first negative electrode wiring, the inter-negative-electrode wiring, and the second negative electrode wiring are disposed so as to form the shape of a crank in the plan view. With the semiconductor device 10 having the above circuit structure, complicated wirings are housed small in block (compactly) in the semiconductor device 10.

The wires 70a may be jumper wires which connect the circuit pattern 32a (vertically extending area 32a1) and the circuit pattern 42a across a space between them. By adopting jumper wires partially apart from the ceramic circuit boards, heat generated due to a current is efficiently transferred to the sealing member 28 and a rise in the temperature of the ceramic circuit boards 30, 40, and is suppressed. Furthermore, the wires 70a connect the ceramic circuit board 30 over which the converter circuit section 25a is disposed and the ceramic circuit board 40 over which the inverter circuit section 25b is disposed across a space between them. The converter circuit section 25a and the inverter circuit section 25b are formed in this way over the separate ceramic circuit boards 30 and 40 respectively and the ceramic circuit boards 30 and 40 are connected by jumper wires, such as the wires 70a, partially apart from the ceramic circuit boards 30 and 40. This suppresses electrical or thermal interference between the converter circuit section 25a and the inverter circuit section 25b. Such jumper wires are not limited to the wires 70a and a lead frame may be used.

The vertically extending area 32a1 of the circuit pattern 32a extends toward the third wall 21c in the Y direction until the vertically extending area 32a1 overlaps the circuit pattern 42a in a side view seen from the second wall 21b. That is to say, the vertically extending area 32a1 is disposed so as to face part of the circuit pattern 42a in the X direction. Furthermore, the wires 70a are connected in the direction from the second wall 21b toward the fourth wall 21d. In addition, it is desirable to make the wires 70a as short as possible. Accordingly, it is desirable to connect an end portion of the vertically extending area 32a1 of the circuit pattern 32a on the side where the third wall 21c is provided and an end portion of the circuit pattern 42a on the side where the second wall 21b is provided. This shortens the length of the wires 70a and suppresses a rise in the temperature of the wires 70a.

Traditionally, wiring is performed between the N terminals 22a1 and the N1 terminals 22d1 from the outside of the case 20 in order to electrically connect the N terminals 22a1 of the converter circuit section 25a in the semiconductor device 10 and the N1 terminals 22d1 of the inverter circuit section 25b in the semiconductor device 10 and make them equal in potential. According to the above method, however, there is no need to perform wiring between the N terminals 22a1 and the N1 terminals 22d1 from the outside of the case 20. Wiring is simplified in this way and does not become a bar to the plurality of terminals formed on the case 20. This improves the handleability of the semiconductor device 10.

Second Embodiment

Figure 7:
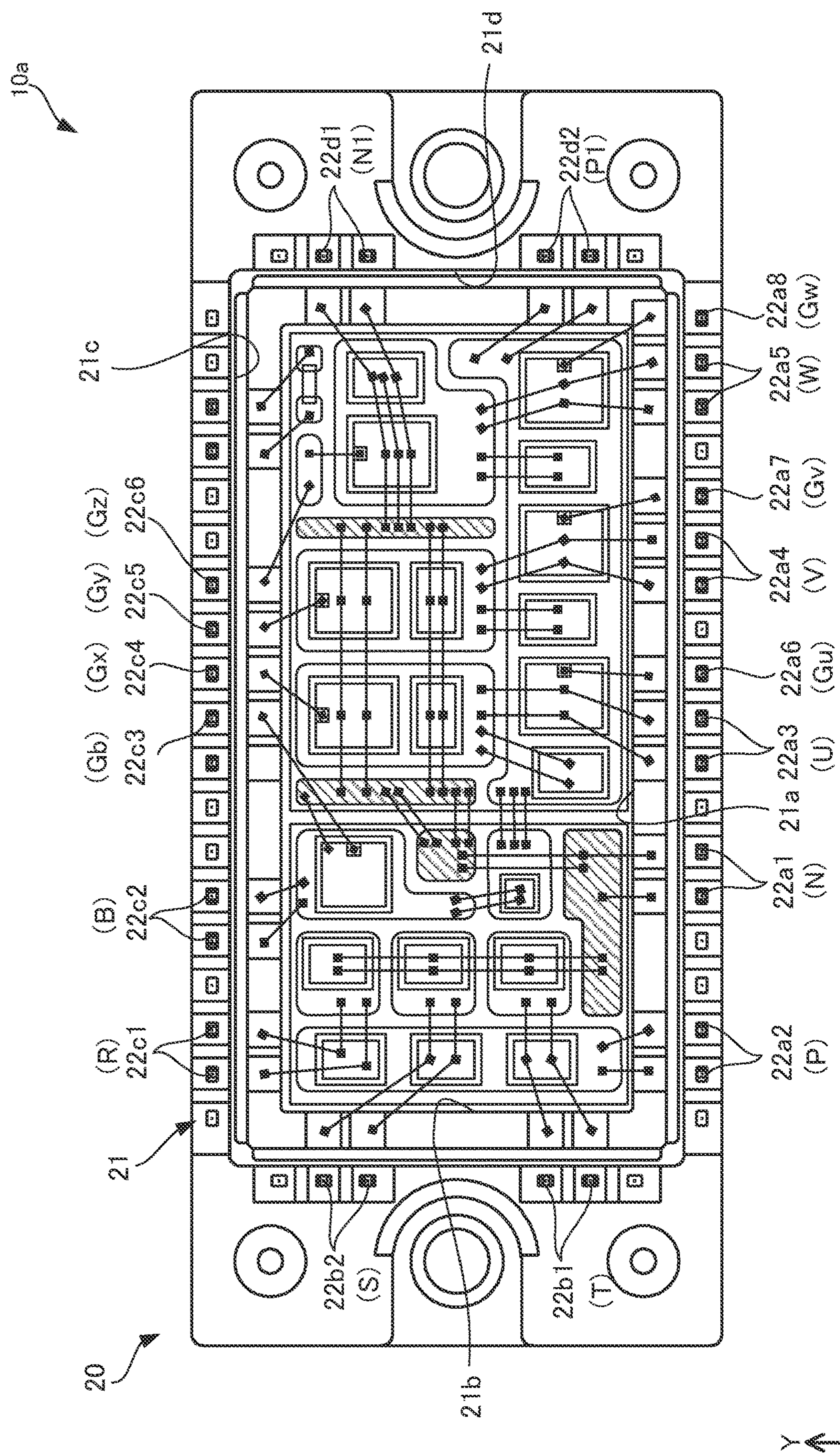
FIG. 7 is a plan view of the inside of a semiconductor device according to a second embodiment (part 1)
Figure 8:
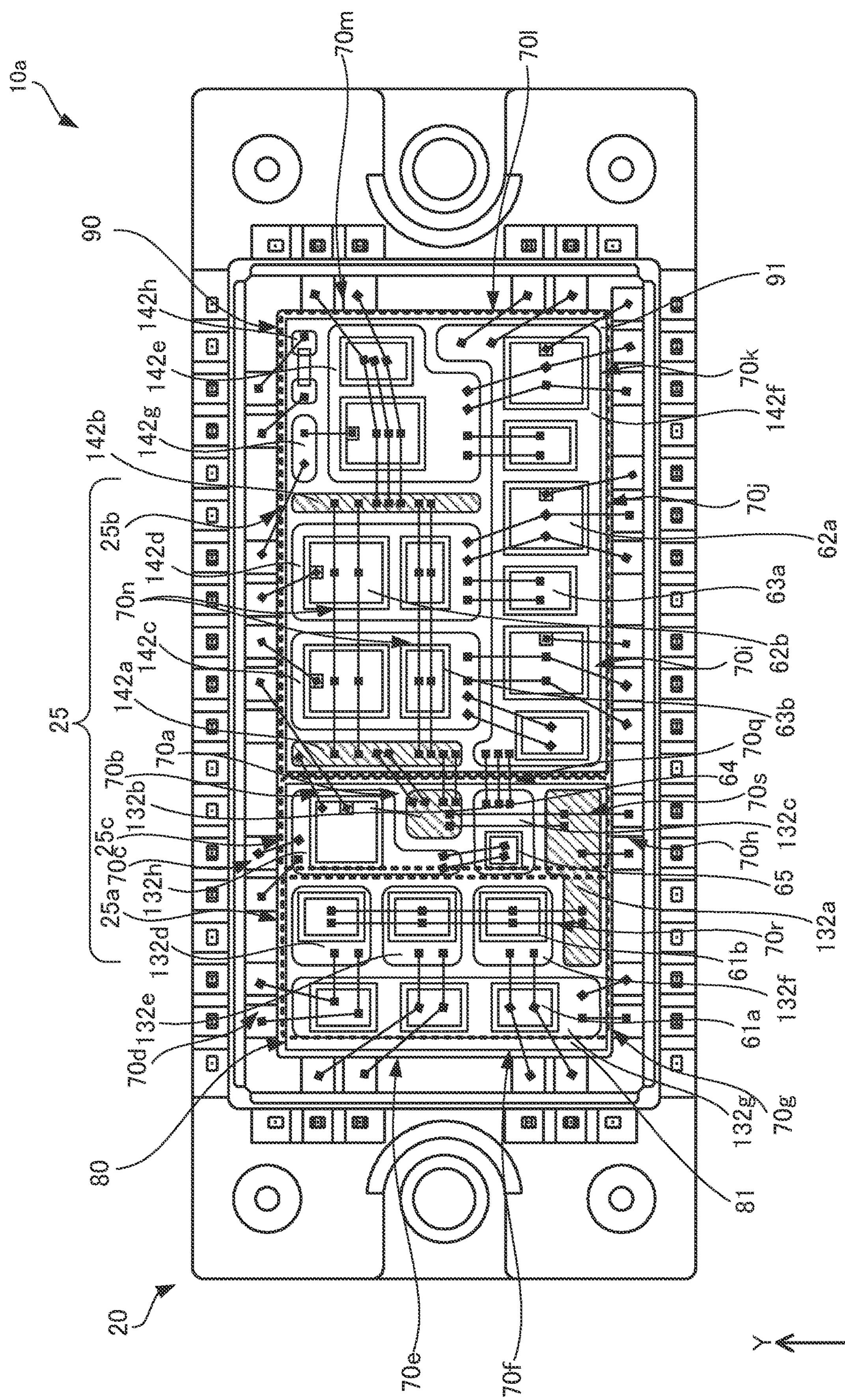
FIG. 8 is a plan view of the inside of a semiconductor device according to a second embodiment (part 2).

Circuit structure in a second embodiment is the same as that in the first embodiment. However, the second embodiment differs from the first embodiment in the structure of a circuit pattern. This case will be described by the use of FIG. 7, FIG. 8, and FIG. 6. FIGS. 7 and 8 are plan views of the inside of a semiconductor device according to the second embodiment. FIGS. 7 and 8 correspond to FIGS. 3 and 4. In FIGS. 7 and 8, a sealing member and a lid portion are not illustrated. Furthermore, FIGS. 7 and 8 are the same drawings. In FIG. 7, components included in a case 20 are marked with numerals. In FIG. 8, ceramic circuit boards and semiconductor elements are marked with numerals. In addition, in FIGS. 7 and 8, only one of a plurality of diode elements of the same kind is also marked with a numeral, only one of a plurality of switching elements of the same kind is also marked with a numeral, and only one of a plurality of wires of the same kind is also marked with a numeral. Moreover, components of a semiconductor device 10a according to the second embodiment which are the same as those of the semiconductor device 10 according to the first embodiment are marked with the same numerals and description of them will be omitted or simplified. Furthermore, the numerals with which the first positive electrode wiring, the second positive electrode wiring, the first negative electrode wiring, and the second negative electrode wiring are marked in FIG. 6 correspond to the case of the first embodiment and do not correspond to the case of the second embodiment.

The semiconductor device 10a includes diode elements 61a, 61b, 63a, 63b, and 65, switching elements 62a, 62b, and 64, ceramic circuit boards 80 and 90, and a case 20 which houses them. The case 20 differs from the case 20 in the first embodiment. However, the case 20 in the second embodiment includes the same components that are included in the case 20 in the first embodiment.

The ceramic circuit boards 80 and 90 are formed in the same way as with the ceramic circuit boards 30, 40, and 50 in the first embodiment. That is to say, the ceramic circuit boards 80 and 90 are rectangular in a plan view. As illustrated in FIG. 7 and FIG. 8, the ceramic circuit boards 80 and 90 are disposed in order over a radiation plate in a housing portion 25 in a direction from a second wall 21b to a fourth wall 21d. The ceramic circuit boards 80 and 90 include circuit patterns 132a through 132h and 142a through 142h formed over the front surfaces of ceramic boards 81 and 91 respectively.

The plurality of diode elements 61*a* and 61*b* included in a converter circuit section 25*a* are placed on the side where the second wall 21*b* is provided (on the −X side) in the housing portion 25. To be concrete, the three diode elements 61*a* on the high potential side are bonded to the circuit pattern 132*g* and are disposed in line on a side nearest the second wall 21*b*. The three diode elements 61*b* on the low potential side are bonded to the circuit patterns 132*f*, 132*e*, and 132*d* respectively and are disposed in line on a side second nearest the second wall 21*b*.

The plurality of switching elements 62*a* and 62*b* and the plurality of diode elements 63*a* and 63*b* included in an inverter circuit section 25*b* are placed on the side where the fourth wall 21*d* is provided (on the +X side) in the housing portion 25. To be concrete, the three switching elements 62*a* and the three diode elements 63*a* on the high potential side are bonded to the circuit pattern 142*f* and are disposed in line on the side where the fourth wall 21*d* is provided (on the +X side) and on a side near a first wall 21*a*. The three switching elements 62*b* and the three diode elements 63*b* on the low potential side are bonded to the circuit patterns 142*c*, 142*d*, and 142*e* respectively and are disposed in line on the side where the fourth wall 21*d* is provided (on the +X side) and on a side which is nearer to a third wall 21*c* than the switching elements 62*a* and the diode elements 63*a* on the high potential side.

The switching element 64 and the diode element 65 included in a brake circuit section 25*c* are bonded to the circuit patterns 132*h* and 132*c* respectively and are disposed in the housing portion 25 between the converter circuit section 25*a* on the side where the second wall 21*b* is provided (on the −X side) and the inverter circuit section 25*b* on the side where the fourth wall 21*d* is provided (on the +X side).

The ceramic circuit boards 130 and 140 and the semiconductor elements are housed in the housing portion 25 of the case 20 surrounded by a side wall portion 21. As illustrated in FIG. 7 and FIG. 8, the circuit patterns, the semiconductor elements, and a plurality of terminals are connected electrically and mechanically by wires 70. As a result, the converter circuit section 25*a*, the inverter circuit section 25*b*, and the brake circuit section 25*c* each of which is indicated in FIG. 8 by an area enclosed by a dashed line are included in the housing portion 25.

In FIG. 6, the converter circuit section 25*a* is represented by the circuit structure indicated in the left area. Furthermore, in FIG. 8, the converter circuit section 25*a* is disposed on the side where the second wall 21*b* is provided (on the −X side). The converter circuit section 25*a* includes the circuit pattern 132*a* and wires 70*r* for connecting the diode elements 61*a* and 61*b* and the circuit pattern 132*a*, which make up a first negative electrode wiring. A first positive electrode wiring is made up of wires 70*g* for connecting P terminals 22*a*2 and the circuit pattern 132*g* and the circuit pattern 132*g* over which the diode elements 61*a* on the high potential side are disposed. Furthermore, the first negative electrode wiring is made up of wires 70*h* for connecting N terminals 22*a*1 and the circuit pattern 132*a*, the circuit pattern 132*a*, and wires 70*r* for connecting the diode elements 61*b* on the low potential side and the circuit pattern 132*a*.

In FIG. 6, the inverter circuit section 25*b* is represented by the circuit structure indicated in the right area. Furthermore, as illustrated in FIG. 8, the inverter circuit section 25*b* is disposed on the side where the fourth wall 21*d* is provided (on the +X side). The inverter circuit section 25*b* includes the circuit patterns 142*a* and 142*b* and wires 70*n* for connecting the circuit patterns 142*a* and 142*b*, which make up a second negative electrode wiring. A second positive electrode wiring is made up of wires 70*l* for connecting P1 terminals 22*d*2 and the circuit pattern 142*f* and the circuit pattern 142*f* over which the switching elements 62*a* and the diode elements 63*a* on the high potential side are disposed. In addition, the second negative electrode wiring is made up of wires 70*m* for connecting N1 terminals 22*d*1 and the circuit pattern 142*b*, the circuit pattern 142*b*, the wires 70*n* for connecting the circuit pattern 142*b* and the circuit pattern 142*a*, and the circuit pattern 142*a*.

In FIG. 6, the brake circuit section 25*c* is represented by the circuit structure indicated in the area between the converter circuit section 25*a* and the inverter circuit section 25*b*. Furthermore, as illustrated in FIG. 8, the brake circuit section 25*c* is disposed over an area between the converter circuit section 25*a* and the inverter circuit section 25*b*. The circuit pattern 132*c*, which is a positive electrode wiring of the brake circuit section 25*c*, is electrically connected through wires 70*g* to the circuit pattern 142*f*, which is the second positive electrode wiring of the inverter circuit section 25*b*. Furthermore, an electrode on the front surface of the switching element 64, which is a negative electrode wiring of the brake circuit section 25*c*, is electrically connected through wires 70*b* to the circuit pattern 142*a*, which is the second negative electrode wiring of the inverter circuit section 25*b*.

With the semiconductor device 10*a* having the above circuit structure, an inter-negative-electrode wiring is made up of wires 70*a* for connecting the circuit pattern 142*a*, which is the second negative electrode wiring, and the circuit pattern 132*b*, the circuit pattern 132*b*, and wires 70*a*, 70*n*, and 70*m* for connecting the circuit pattern 132*b* and the N terminals 22*a*1. Furthermore, the circuit pattern 142*a*, which is the second negative electrode wiring, and the circuit pattern 132*a*, which is the first negative electrode wiring are connected electrically and mechanically by the inter-negative-electrode wiring. As a result, the N terminals 22*a*1 and the N1 terminals 22*d*1 are electrically connected in the semiconductor device 10*a* and are equal in potential.

Furthermore, as illustrated in FIG. 8, the first negative electrode wiring is disposed near the second wall 21*b* on the side where the first wall 21*a* is provided, and the second negative electrode wiring is disposed near the fourth wall 21*d* on the side where the third wall 21*c* is provided. In addition, the inter-negative-electrode wiring extends in a direction from the first wall 21*a* toward the third wall 21*c* between the converter circuit section 25*a* near the second wall 21*b* and the inverter circuit section 25*b* near the fourth wall 21*d*. That is to say, the second negative electrode wiring and the inter-negative-electrode wiring are disposed so as to form the shape of the letter "L" in a plan view. Moreover, the first negative electrode wiring and the inter-negative-electrode wiring are disposed so as to form the shape of the letter "L" in the plan view. Furthermore, the first negative electrode wiring, the inter-negative-electrode wiring, and the second negative electrode wiring are disposed so as to form the shape of a crank in the plan view. With the semiconductor device 10*a* having the above circuit structure, wirings are housed small in block (compactly) in the semiconductor device 10*a*.

With the semiconductor device 10*a* having the above circuit structure, the second negative electrode wiring (circuit pattern 142*a*) connected to the N1 terminals 22*d*1 and the circuit pattern 132*b* connected through the wires 70 and the circuit pattern 132*a* to the N terminals 22*a*1 are connected electrically and mechanically by the wires 70*a*. As a result, the N terminals **22*a*1 and the N1 terminals 22*d*1 are electrically connected in the semiconductor device 10*a*** and are equal in potential.

According to the disclosed technique, wirings are simplified and handleability is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:

a converter circuit including a first positive electrode wiring as a positive electrode of the converter circuit, a first negative electrode wiring as a negative electrode of the converter circuit, and an input wiring as an input of the converter circuit;

an inverter circuit including a second positive electrode wiring as a positive electrode of the inverter circuit, a second negative electrode wiring as a negative electrode of the inverter circuit, and an output wiring as an output of the inverter circuit;

an inter-negative-electrode wiring disposed between the converter circuit and the inverter circuit and electrically connecting the first negative electrode wiring and the second negative electrode wiring; and a plurality of terminals including a first negative electrode terminal electrically connected to the first negative electrode wiring, a second negative electrode terminal electrically connected to the second negative electrode wiring, and an output terminal disposed between the first negative electrode terminal and the second negative electrode terminal and being electrically connected to the output wiring.

2. The semiconductor device according to claim 1, wherein the second negative electrode wiring and the inter-negative-electrode wiring are disposed so as to form a shape of a letter "L" in a plan view of the semiconductor device.

3. The semiconductor device according to claim 1, wherein the first negative electrode wiring and the inter-negative-electrode wiring are disposed so as to form a shape of a letter "L" in a plan view of the semiconductor device.

4. The semiconductor device according to claim 1, wherein the first negative electrode wiring, the second negative electrode wiring, and the inter-negative-electrode wiring are disposed so as to form a shape of a crank in a plan view of the semiconductor device.

5. The semiconductor device according to claim 1, further comprising a case which houses the converter circuit, the inverter circuit, and the inter-negative-electrode wiring and which has the plurality of terminals, wherein:

the case includes a side wall portion which has a shape of a frame in a plan view of the semiconductor device and which has a first wall, a second wall, a third wall and a fourth wall in that order to surround a housing space that houses the converter circuit, the inverter circuit, and the inter-negative-electrode wiring;

the first negative electrode terminal is disposed on the first wall;

the second negative electrode terminal is disposed on the fourth wall at a side where the third wall is provided;

the output terminal is disposed on the first wall at a side where the fourth wall is provided;

the first negative electrode wiring is disposed at a side where the first wall is provided; and the second negative electrode wiring is disposed at the side where the third wall is provided and extends in a direction from the fourth wall toward the second wall.

6. The semiconductor device according to claim 5, wherein:

the housing space of the case is rectangular in the plan view;

the first wall and the third wall are long sides; and the second wall and the fourth wall are short sides shorter in length direction thereof than lengths of the first wall and third wall measured in length directions thereof.

7. The semiconductor device according to claim 5, wherein the inter-negative-electrode wiring extends in a direction from the first wall toward the third wall between the converter circuit and the inverter circuit.

8. The semiconductor device according to claim 5, further comprising a first board and a second board, wherein:

the converter circuit is formed on the first board;

the inverter circuit is formed on the second board; and the inter-negative-electrode wiring includes a jumper wire which electrically connects the first negative electrode wiring and the second negative electrode wiring across a space between the first board and the second board.

9. The semiconductor device according to claim 8, wherein:

the first board includes a first insulating plate and a plurality of first circuit patterns provided on a front surface of the first insulating plate to form the converter circuit; and the second board includes a second insulating plate and a plurality of second circuit patterns provided on a front surface of the second insulating plate to form the inverter circuit.

10. The semiconductor device according to claim 9, wherein:

the first negative electrode wiring is included in the first negative electrode circuit pattern, and the first negative electrode circuit pattern is included in the plurality of first circuit patterns; and the second negative electrode wiring is included in the second negative electrode circuit pattern, and the second negative electrode circuit pattern is included in the plurality of second circuit patterns.

11. The semiconductor device according to claim 10, wherein:

the first negative electrode circuit pattern extends in a direction from the second wall toward the fourth wall at a side where the first wall is provided;

the inter-negative-electrode wiring includes a first extending portion extending from an end portion of the first negative electrode circuit pattern located at a side where the fourth wall is provided in a direction from the first wall toward the third wall; and the first extending portion extends so as to overlap the second negative electrode circuit pattern in a side view of the semiconductor device seen from the second wall.

12. The semiconductor device according to claim 11, wherein the jumper wire connects an end portion of the first extending portion at a side where the third wall is provided and an end portion of the second negative electrode circuit pattern at a side where the second wall is provided.

13. The semiconductor device according to claim 10, wherein:

the second negative electrode circuit pattern extends in a direction from the fourth wall toward the second wall at a side where the third wall is provided on the second insulating plate;

the inter-negative-electrode wiring includes a first extending portion extending in a direction from the first wall toward the third wall; and the second negative electrode circuit pattern extends up to a point that is in front of the first extending portion.

14. The semiconductor device according to claim 13, wherein the jumper wire connects an end portion of the second extending portion of the second negative electrode circuit pattern at a side where the second wall is provided and an end portion of the first negative electrode circuit pattern at a side where the fourth wall is provided.

15. The semiconductor device according to claim 8, further comprising a brake circuit between the converter circuit and the inverter circuit, the brake circuit including a third positive electrode wiring as a positive electrode of the brake circuit, electrically connected to the second positive electrode wiring of the inverter circuit, and a third negative electrode wiring as a negative electrode of the brake circuit, electrically connected to the second negative electrode wiring of the inverter circuit.

16. The semiconductor device according to claim 15, further comprising a plurality of third circuit patterns forming the brake circuit.

* * * * *